United States Patent
Lee

(10) Patent No.: US 11,848,065 B2
(45) Date of Patent: *Dec. 19, 2023

(54) IMPEDANCE CALIBRATION VIA A NUMBER OF CALIBRATION CIRCUITS, AND ASSOCIATED METHODS, DEVICES AND SYSTEMS

(71) Applicant: Micron Technology, Inc., Boise, ID (US)

(72) Inventor: Hyunui Lee, Seoul (KR)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/446,559

(22) Filed: Aug. 31, 2021

(65) Prior Publication Data

US 2021/0391028 A1    Dec. 16, 2021

Related U.S. Application Data

(63) Continuation of application No. 16/848,093, filed on Apr. 14, 2020, now Pat. No. 11,145,383.

(51) Int. Cl.
| | | |
|---|---|---|
| *G11C 7/04* | (2006.01) | |
| *G11C 29/12* | (2006.01) | |
| *G11C 29/02* | (2006.01) | |
| *G11C 7/10* | (2006.01) | |
| *G11C 29/56* | (2006.01) | |

(52) U.S. Cl.
CPC ........ *G11C 29/1201* (2013.01); *G11C 7/1051* (2013.01); *G11C 7/1078* (2013.01); *G11C 29/022* (2013.01); *G11C 2029/5602* (2013.01); *G11C 2207/2254* (2013.01)

(58) Field of Classification Search
CPC . G11C 29/1201; G11C 7/1051; G11C 7/1078; G11C 29/022; G11C 2207/2254; G11C 2029/56

See application file for complete search history.

(56) References Cited

U.S. PATENT DOCUMENTS

| | | | |
|---|---|---|---|
| 9,666,245 B2 | 5/2017 | Arai et al. | |
| 9,935,632 B1 | 4/2018 | Gans | |
| 10,156,893 B1* | 12/2018 | Kojima | ............... H04L 25/0278 |

(Continued)

FOREIGN PATENT DOCUMENTS

| | | |
|---|---|---|
| CN | 101132173 A | 2/2008 |
| CN | 106205662 | 10/2020 |
| JP | 2013-051464 A | 3/2013 |

OTHER PUBLICATIONS

Chinese First Office Action and Search Report for Chinese Application No. 202110366812.8, dated Mar. 11, 2022, 10 pages with translation.

*Primary Examiner* — Mushfique Siddique
(74) *Attorney, Agent, or Firm* — TraskBritt

(57) ABSTRACT

Semiconductor devices are disclosed. A semiconductor device may include a number of impedance calibration circuits and an interpolation circuit. The interpolation circuit may be configured to generate a calibration code based on two or more other calibration codes generated via one or more impedance calibration circuits of the number of impedance calibration circuits, another interpolation circuit, or any combination thereof. Methods and systems are also disclosed.

20 Claims, 10 Drawing Sheets

(56) References Cited

U.S. PATENT DOCUMENTS

| | | | |
|---|---|---|---|
| 10,504,571 B1 | 12/2019 | Johnson et al. | |
| 10,747,245 B1* | 8/2020 | He | G11C 29/12005 |
| 2007/0148796 A1 | 6/2007 | Nakamura et al. | |
| 2009/0259425 A1* | 10/2009 | Ku | H03K 19/0005 |
| | | | 702/104 |
| 2009/0289658 A1* | 11/2009 | Moon | H03K 19/0005 |
| | | | 326/30 |
| 2011/0216612 A1* | 9/2011 | Ishikawa | G11C 29/022 |
| | | | 365/194 |
| 2015/0340069 A1 | 11/2015 | Arai et al. | |
| 2016/0071616 A1 | 3/2016 | Jeong | |
| 2017/0162238 A1 | 6/2017 | Lee et al. | |
| 2018/0167055 A1* | 6/2018 | Gans | G11C 29/025 |
| 2020/0059232 A1 | 2/2020 | Johnson | |

\* cited by examiner

IMPEDANCE CALIBRATION VIA A NUMBER OF CALIBRATION CIRCUITS, AND ASSOCIATED METHODS, DEVICES AND SYSTEMS

CROSS-REFERENCE TO RELATED APPLICATION

This application is a continuation of U.S. patent application Ser. No. 16/848,093, filed Apr. 14, 2020, now U.S. Pat. No. 11,145,383, issued Oct. 12, 2021, the disclosure of which is hereby incorporated herein in its entirety by this reference.

TECHNICAL FIELD

Embodiments of the disclosure relate generally to semiconductor device impedance calibration. More specifically, various embodiments relate to performing ZQ calibration, and to related methods, devices, and systems.

BACKGROUND

Semiconductor memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory. Semiconductor memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

A semiconductor device, such as low power dynamic random access memory (LPDRAM) devices (and other similar semiconductor devices), may use a ZQ calibration process to tune certain components of the semiconductor device, such as input/output (I/O) drivers, on-die termination components, and/or other components across changes in process, voltage, and/or temperature. In particular, a ZQ calibration process may use a periodic (e.g., as commanded by a memory controller) calibration to compare components with reference values to maintain consistent impedance across process, voltage, and/or temperature (PVT). However, a ZQ calibration process may lose accuracy if, for example, a process variation effect of one area of the semiconductor device is different than a process variation effect of another area of the semiconductor device.

DETAILED DESCRIPTION

Figure 1:
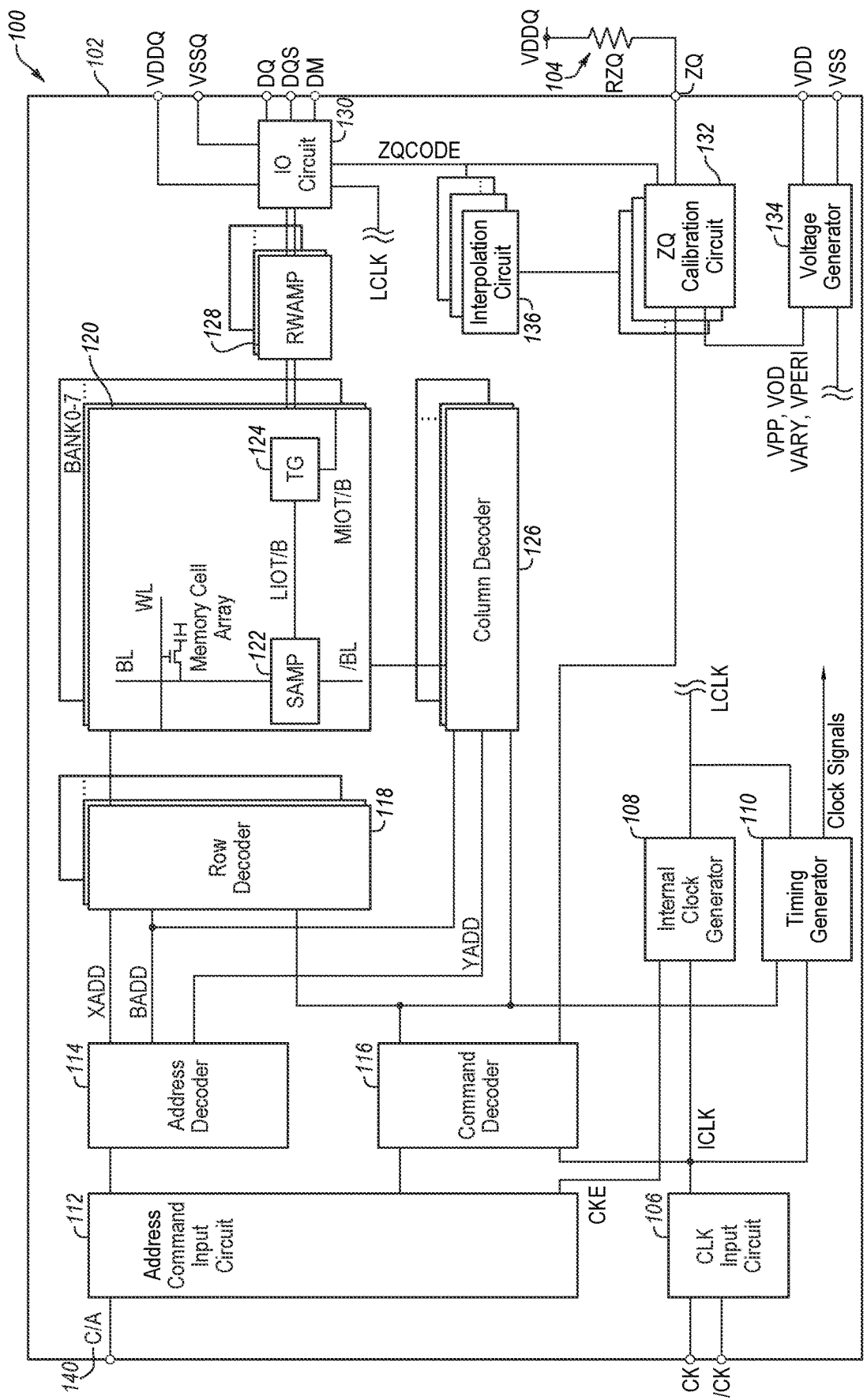
FIG. 1 is a block diagram of an example semiconductor memory device, in accordance with at least one embodiment of the present disclosure.

Semiconductor memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored information in the memory device. To store information, the electronic device may write, or program, the state in the memory device.

Semiconductor memory devices may be volatile or non-volatile. A non-volatile memory device (e.g., Flash memory) can store data for extended periods of time even in the absence of an external power source. A volatile memory device (e.g., DRAM) may lose its stored state over time unless it is periodically refreshed by an external power source. A binary memory device may, for example, include a charged or discharged capacitor.

A semiconductor device, such as a microcomputer, memory, gate array, among others, may include input/output (I/O) pins and an output circuit for transmitting data to other devices, via a bus, transmission lines formed on a board, and the like. The semiconductor device may include a circuit that controls transmitting the data and may include, for example, output buffers and drivers. To consistently and accurately transmit data, an impedance of the semiconductor device may be matched to an impedance of a transmission network and/or a receiving device.

A semiconductor device, such as low power dynamic random access memory (LPDRAM) devices (and other similar semiconductor devices), may use a ZQ calibration process to tune certain components of the semiconductor device, such as input/output (I/O) drivers, on-die termination components, and/or other components across changes in process, voltage, and/or temperature. In particular, a ZQ calibration process may use a periodic (e.g., as commanded by a memory controller) calibration to compare components with reference values to maintain consistent impedance across process, voltage, and/or temperature (PVT). However, a ZQ calibration process may lose accuracy if, for example, a process variation effect of one area of the semiconductor device is different than a process variation effect of another area of the semiconductor device.

As described more fully below, various embodiments described herein may be related to performing ZQ calibration of a semiconductor device via a number of ZQ calibration circuits and at least one interpolation circuit. More specifically, as described more fully below, various embodiments of the present disclosure include a semiconductor device including an input/output (I/O) interface area (e.g., including a number of I/O buffers). Further, the semiconductor device may include a number of ZQ calibration circuits, wherein each of the number of ZQ calibration circuits is positioned adjacent to an associated portion of the I/O interface area. The semiconductor may further include a number of interpolation circuits, wherein each of the number of interpolation circuits is positioned adjacent to an associated portion of the I/O interface area. According to some embodiments, at least some portions of the I/O interface area that are associated with the number of interpolation circuits are at least partially positioned between at least some portions of the I/O interface area that are associated with the number of ZQ calibration circuits. Each interpolation circuit may be configured to perform a calibration operation based on data (e.g., a number of (e.g., two) calibration codes) received from a number of (e.g., two) other circuits (e.g., one or more other interpolations circuits and/or one or more other ZQ calibration circuits).

According to some embodiments, during a contemplated operation of a semiconductor device, a first calibration code for a first portion of an input/output (I/O) interface area (e.g., including a number of I/O buffers) of a semiconductor device may be determined via a first ZQ calibration circuit that is associated with (e.g., positioned adjacent to) the first portion. Further, a second calibration code for a second portion of the I/O interface area may be determined via a second ZQ calibration circuit that is associated with (e.g., positioned adjacent to) the second portion. Additionally, a third calibration code for a third portion of the I/O interface area may be determined based on the first calibration code and the second calibration code, wherein the third portion is positioned at least partially between the first portion and the second portion. The third calibration code may be determined via an interpolation circuit associated with (e.g., positioned adjacent to) the third portion.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

FIG. 1 is a schematic block diagram of a semiconductor memory device 100, in accordance with various embodiments of the present disclosure. For example, semiconductor memory device 100 may include an integrated circuit 102 and a ZQ resistor (RZQ) 104. Integrated circuit 102 may include a clock input circuit 106, an internal clock generator 108, a timing generator 110, an address/command input circuit 112, an address decoder 114, a command decoder 116, and a number of row decoders 118. Semiconductor memory device 100 further includes a memory cell array 120 including sense amplifiers 122 and transfer gates 124. Semiconductor memory device 100 also include a number of column decoders 126, a plurality of read/write amplifiers 128, an input/output (I/O) circuit 130, a number of ZQ calibration circuits 132, a voltage generator circuit 134, and a number of interpolation circuits 136. As described more fully below, each of ZQ calibration circuits 132 and each of interpolation circuits 136 may be associated with a portion (e.g., a number of output drivers) of input/output circuit 130.

Semiconductor memory device 100 may include a plurality of external terminals including address and command terminals coupled to a command/address bus 140, clock terminals CK and /CK, data terminals DQ, DQS, and DM, power supply terminals VDD, VSS, VDDQ, and VSSQ, and a calibration terminal ZQ. Integrated circuit 102 may be mounted on a substrate, for example, a memory module substrate, a mother board, or the like.

Memory cell array 120 includes a number of banks, each bank including a number of word lines WL, a number of bit lines BL, and a number of memory cells MC arranged at intersections of the number of word lines WL and the number of bit lines BL. The selection of the word line WL for each bank is performed by a corresponding row decoder 118 and the selection of the bit line BL is performed by a corresponding column decoder 126. The number of sense amplifiers 122 are located for their corresponding bit lines BL and coupled to at least one respective local I/O line further coupled to a respective one of at least two main I/O line pairs, via transfer gates TG 124, which function as switches.

Address/command input circuit 112 may receive an address signal and a bank address signal from outside of semiconductor memory device 100 at the command/address terminals via command/address bus 140 and transmit the address signal and the bank address signal to address decoder 114. Address decoder 114 may decode the address signal received from address/command input circuit 112 and provide a row address signal XADD to row decoder 118, and a column address signal YADD to column decoder 126. Address decoder 114 may also receive the bank address signal and provide the bank address signal BADD to row decoder 118 and column decoder 126.

Address/command input circuit 112 may receive a command signal from outside of semiconductor memory device 100, such as, for example, a memory controller at the command/address terminals via command/address bus 140 and provide the command signal to command decoder 116. Command decoder 116 may decode the command signal and provide or generate various internal command signals. For example, the internal command signals may include a row command signal to select a word line, a column command signal, such as a read command or a write command, to select a bit line, and a ZQ calibration command that may activate one or more of ZQ calibration circuits 132 and/or one or more of interpolation circuits 136.

Accordingly, when a read command is issued and a row address and a column address are timely supplied with the read command, read data is read from a memory cell in memory cell array 120 designated by the row address and the column address. Read/write amplifiers 128 may receive the read data and provide the read data to input/output circuit 130. Input/output circuit 130 may provide the read data to outside of semiconductor memory device 100 via the data terminals DQ, DQS and DM together with a data strobe signal at DQS and a data mask signal at terminal DM. Similarly, when a write command is issued and a row address and a column address are timely supplied with the write command, input/output circuit 130 may receive write data at the data terminals DQ, DQS, DM, together with a data strobe signal at DQS and a data mask signal at DM, and provide the write data via read/write amplifiers 128 to memory cell array 120. Thus, the write data may be written in the memory cell designated by the row address and the column address.

Turning to the explanation of the external terminals included in semiconductor memory device 100, clock terminals CK and /CK may receive an external clock signal and a complementary external clock signal, respectively. The external clock signals (including the complementary external clock signal) may be supplied to clock input circuit 106. Clock input circuit 106 may receive the external clock signals and generate internal clock signal ICLK. Clock input circuit 106 may provide internal clock signal ICLK to internal clock generator 108. Internal clock generator 108 may generate a phase controlled internal clock signal LCLK based on the received internal clock signal ICLK and a clock enable signal CKE from address/command input circuit 112. Although not limited thereto, a DLL circuit may be used as internal clock generator 108. Internal clock generator 108 may provide the phase controlled internal clock signal LCLK to the input/output circuit 130 and timing generator 110. Input/output circuit 130 may use the phase controller internal clock signal LCLK as a timing signal for determining an output timing of read data. Timing generator 110 may receive internal clock signal ICLK and generate various internal clock signals.

The power supply terminals may receive power supply voltages VDD and VSS. Power supply voltages VDD and VSS may be supplied to voltage generator circuit 134. Voltage generator circuit 134 may generate various internal voltages, VPP, VOD, VARY, VPERI, and the like based on power supply voltages VDD and VSS. Internal voltage VPP may be used in row decoder 118, internal voltages VOD and VARY may be used in sense amplifiers 122 included in memory cell array 120, and internal voltage VPERI may be used in many other circuit blocks. The power supply terminals may also receive power supply voltages VDDQ and VSSQ. Input/output circuit 130 may receive power supply voltages VDDQ and VSSQ. For example, power supply voltages VDDQ and VSSQ may be the same voltages as power supply voltages VDD and VSS, respectively. However, dedicated power supply voltages VDDQ and VSSQ may be used for input/output circuit 130 and ZQ calibration circuits 132. In some embodiments, ZQ calibration circuits 132 may receive power via voltage generator 134.

Calibration terminal ZQ of semiconductor memory device 100 may be coupled to ZQ calibration circuits 132. Each ZQ calibration circuit 132 may perform a calibration operation with reference to an impedance of ZQ resistor (RZQ) 104. In some examples, ZQ resistor (RZQ) 104 may be mounted on a substrate that is coupled to calibration terminal ZQ. For example, ZQ resistor (RZQ) 104 may be coupled to power supply voltage (VDDQ). Further, according to various embodiments, each interpolation circuit 136 may be configured to may perform a calibration operation based on data (e.g., a number of (e.g., two) calibration codes) received from a number of (e.g., two) other circuits (e.g., one or more other interpolation circuits and/or one or more other ZQ calibration circuits).

As will be appreciated, an impedance code (ZQCODE) obtained by a calibration operation may be provided to input/output circuit 130, and thus an impedance of an output buffer (not shown) included in input/output circuit 130 may be specified. In some embodiments, a ZQ latch (not shown in FIG. 1) may store a calibration code and transfer a calibration code to one or more I/O buffers responsive to a ZQ latch command.

Figure 2:
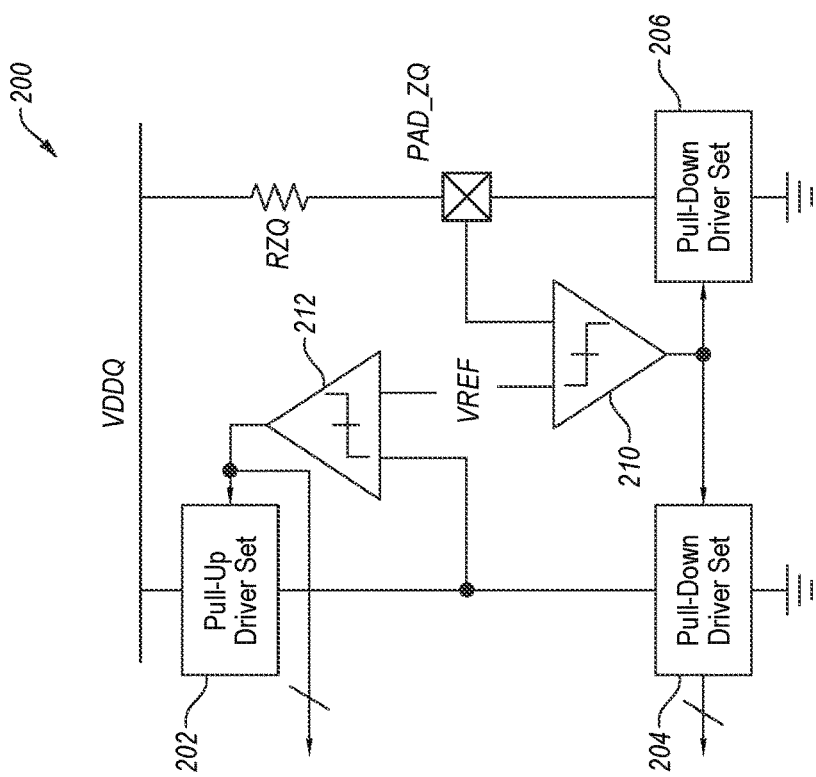
FIG. 2 depicts a simplified diagram of an example ZQ calibration circuit.

FIG. 2 depicts a simplified diagram of an example ZQ calibration circuit 200. ZQ calibration circuit 200 includes a pull-up driver 202, a pull-down driver 204, a pull-down driver 206, comparators 210 and 212, and a pad PAD_ZQ, which is coupled to power supply voltage VDDQ via resistor RZQ. In some embodiments, pull-down driver 204 and pull-down driver 206 may include the same or similar circuitry. As will be appreciated by a person having ordinary skill in the art, ZQ calibration circuit 200 may generate one or more codes to adjust an impedance of associated I/O circuitry (e.g., I/O buffers). More specifically, the one or more codes generated via ZQ calibration circuit 200 may enable or disable one or more transistors of output circuitry (e.g., one or more output drivers of input/output circuit 130 of FIG. 1). Further, according to various embodiments described more fully below, one or more codes generated via ZQ calibration circuit 200 may be conveyed to one or more interpolation circuits (e.g., interpolation circuits 136 of FIG. 1).

Figure 3:
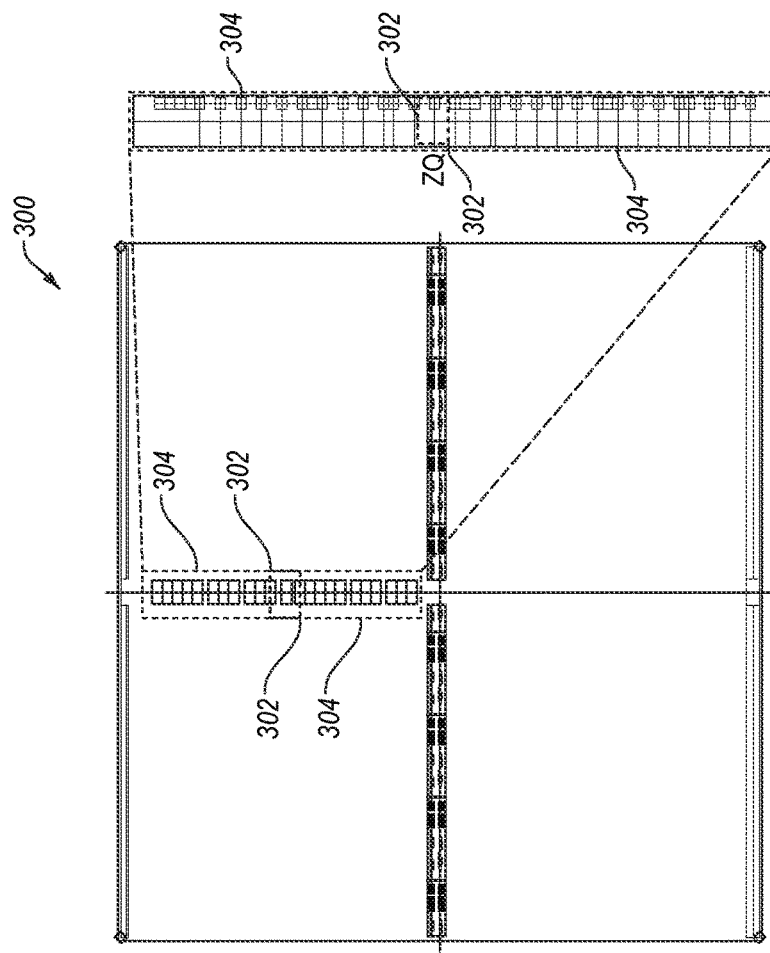
FIG. 3 is a layout diagram of an example memory device.
Figure 4:
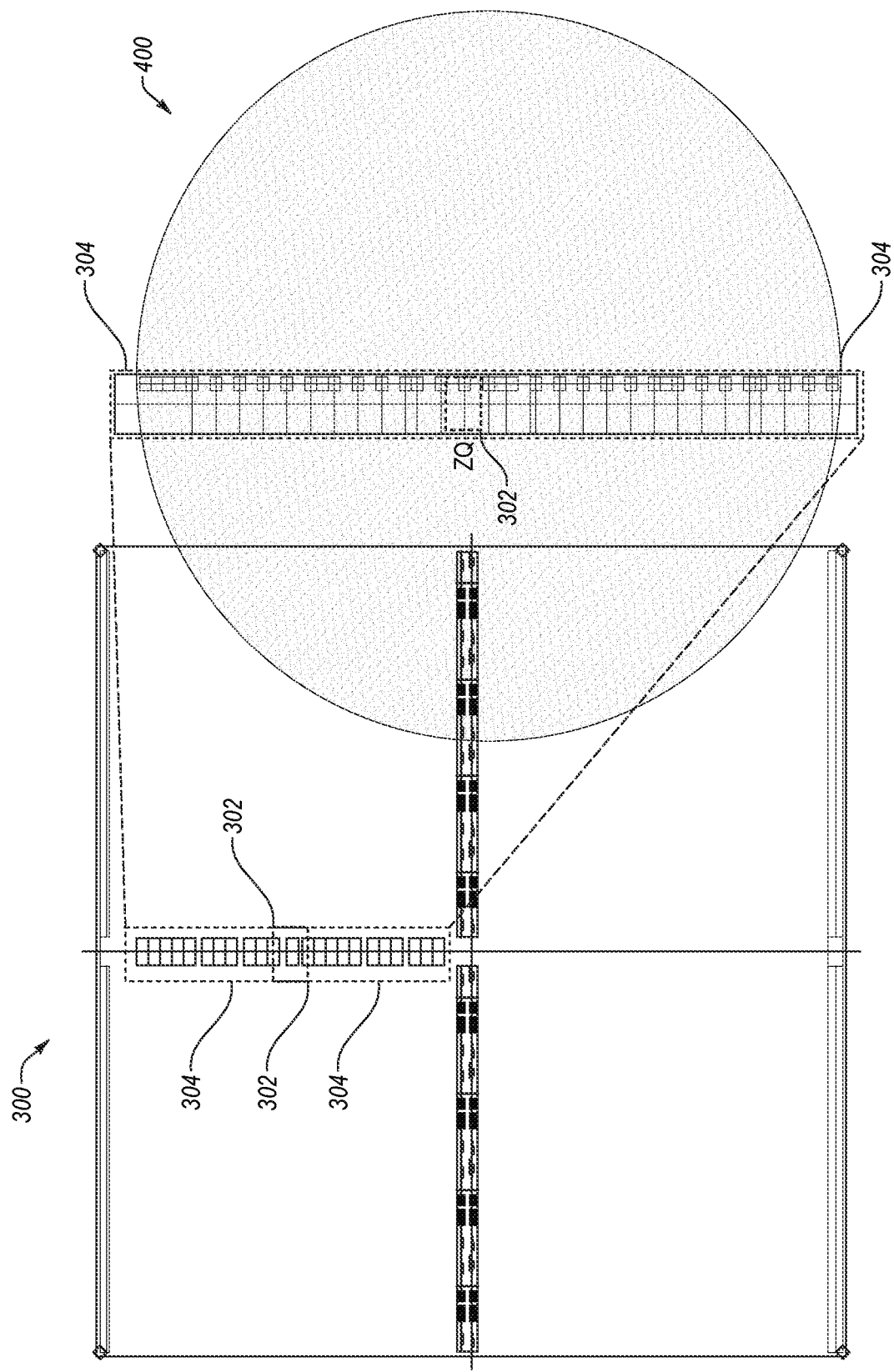
FIG. 4 is a layout diagram of another example memory device including a ZQ coverage area of a ZQ calibration unit.

FIG. 3 is a layout diagram of an example memory device 300. Memory device 300 includes a ZQ calibration unit 302 (e.g., including a ZQ calibration circuit) positioned proximate a center of a DQ PAD area 304 (i.e., including a number of DQ circuits). Because ZQ calibration unit 302 is proximate a center of DQ PAD area 304, a coverage area of ZQ calibration unit 302 may, in some examples, cover each DQ circuit of DQ PAD area 304. For example, FIG. 4 incudes a layout diagram of memory device 300 and a coverage area 400 of ZQ calibration unit 302. Coverage area 400 may also be referred to herein as a "ZQ coverage area," an "effective ZQ calibration code area," a "ZQ code area," an "effective area," or some other variation thereof. For example only, a diameter of coverage area 400 may be approximately 3200 micrometers (μm). Thus, as will be appreciated, an area limitation of a ZQ coverage area exists. In other words, depending on a size of a memory device, a ZQ coverage area of ZQ calibration unit of the memory device may or may not cover each DQ pad of the memory device.

Figure 5:
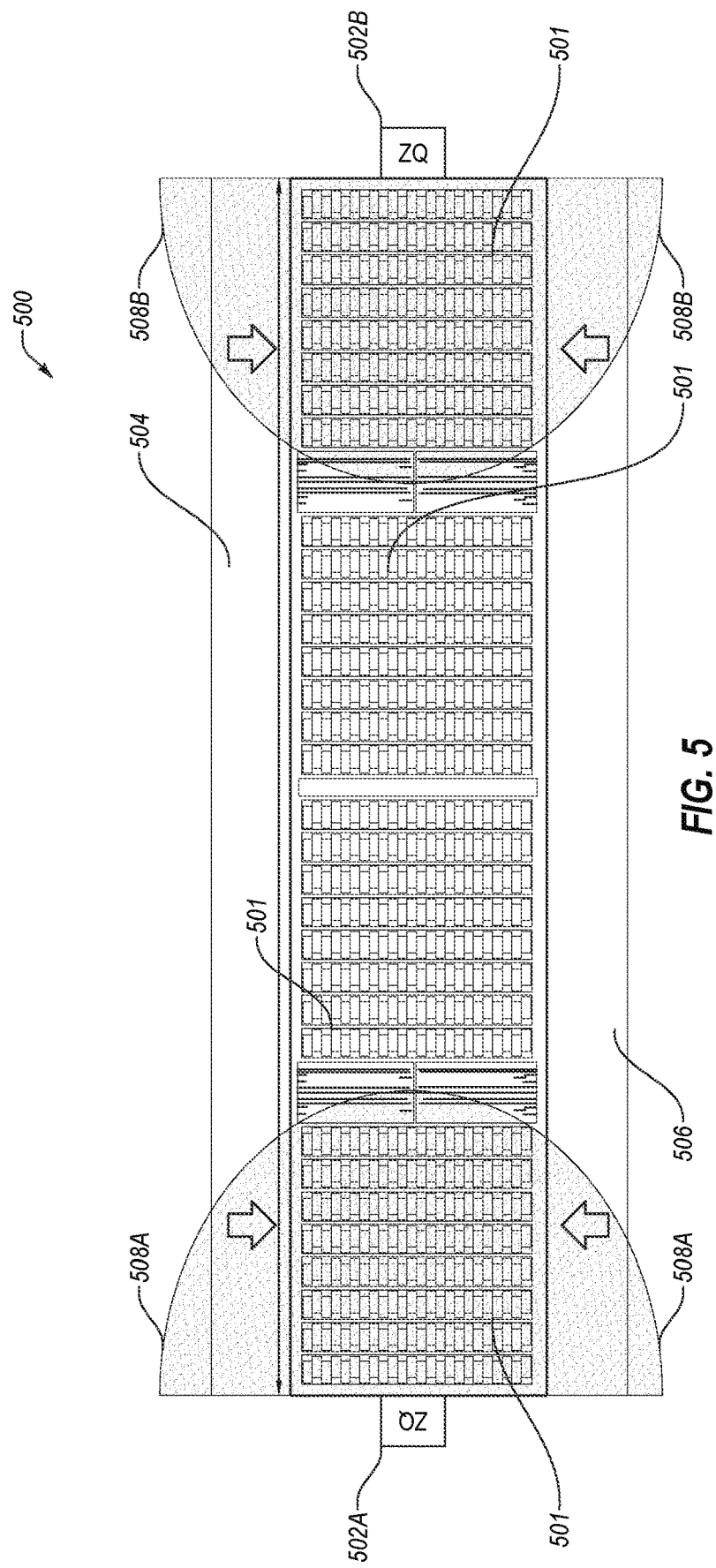
FIG. 5 is a layout diagram of another example memory device including a number of ZQ calibration circuits.

FIG. 5 is another layout diagram of an example memory device 500 including a number of ZQ calibration circuits. For example, memory device 500 may include a high bandwidth memory (HBM) device. In this example, memory device 500 includes an input/output (I/O) interface (also referred to herein as a PHY area) 501 and two ZQ calibration circuits 502A and 502B positioned on opposite edges of I/O interface 501. For example, I/O interface 501 may include a length of approximately 1200 μm and a width of approximately 6,000 μm. Memory device 500 further includes areas 504 and 506, which may include one or more data buses (e.g., high speed data buses) and/or high speed circuitry. As will be appreciated, ZQ calibrations circuits may not be positioned within a PHY area due to the density of the PHY area.

Assuming each ZQ calibration circuit 502A and 502B has a coverage area 508 of approximately 3200 μm (as noted above with respect to FIG. 4), a portion of I/O interface 501 may not be included within coverage area 508. Therefore, if a process variation in an uncovered area (e.g., at or near a center of I/O interface 501) is different than a process variation of a covered area (e.g., at the edges of I/O interface 501), an output impedance of the uncovered area may not be calibrated correctly.

Figure 6:
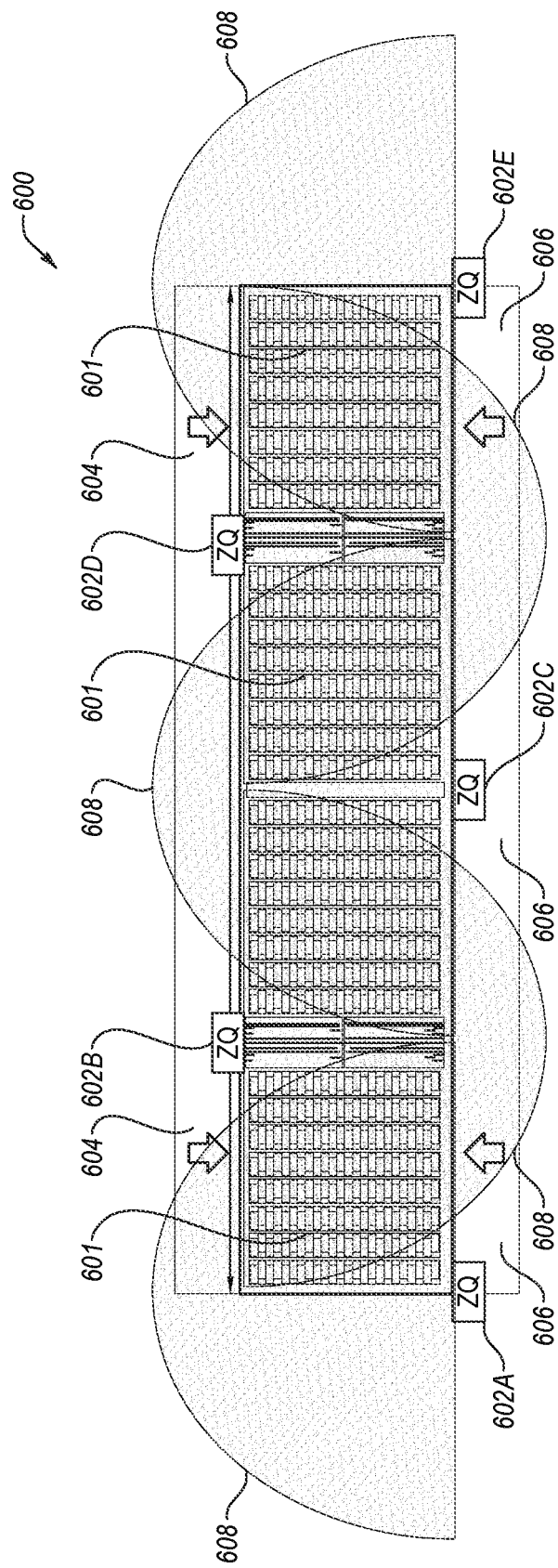
FIG. 6 is a layout diagram of yet another example memory device including a number of ZQ calibration circuits.

FIG. 6 is a layout diagram of another example memory device 600 including a number of ZQ calibration circuits 602 (i.e., ZQ calibration circuits 602A-602E). Like memory device 500, memory device 600 includes an input/output (I/O) interface (also referred to herein as a PHY area) 601. For example, I/O interface 601 may include a length of approximately 1200 μm and a width of approximately 6,000 μm. Memory device 600 further includes areas 604 and 606, which may include one or more data buses (e.g., high speed data buses) and/or high speed circuitry. Together, ZQ calibration circuits 602A-602E form a coverage area 608.

As will be appreciated, ZQ calibration circuits 602 may consume a relatively large amount of area and may increase design complexity. Further, the locations of ZQ calibration circuits 602 may interrupt a data bus line (e.g., within area 604 and/or area 606), which is critical for a relatively large I/O interface. Therefore, simply increasing a number of ZQ calibration circuits to provide a sufficient coverage area may be undesirable.

Figure 7:
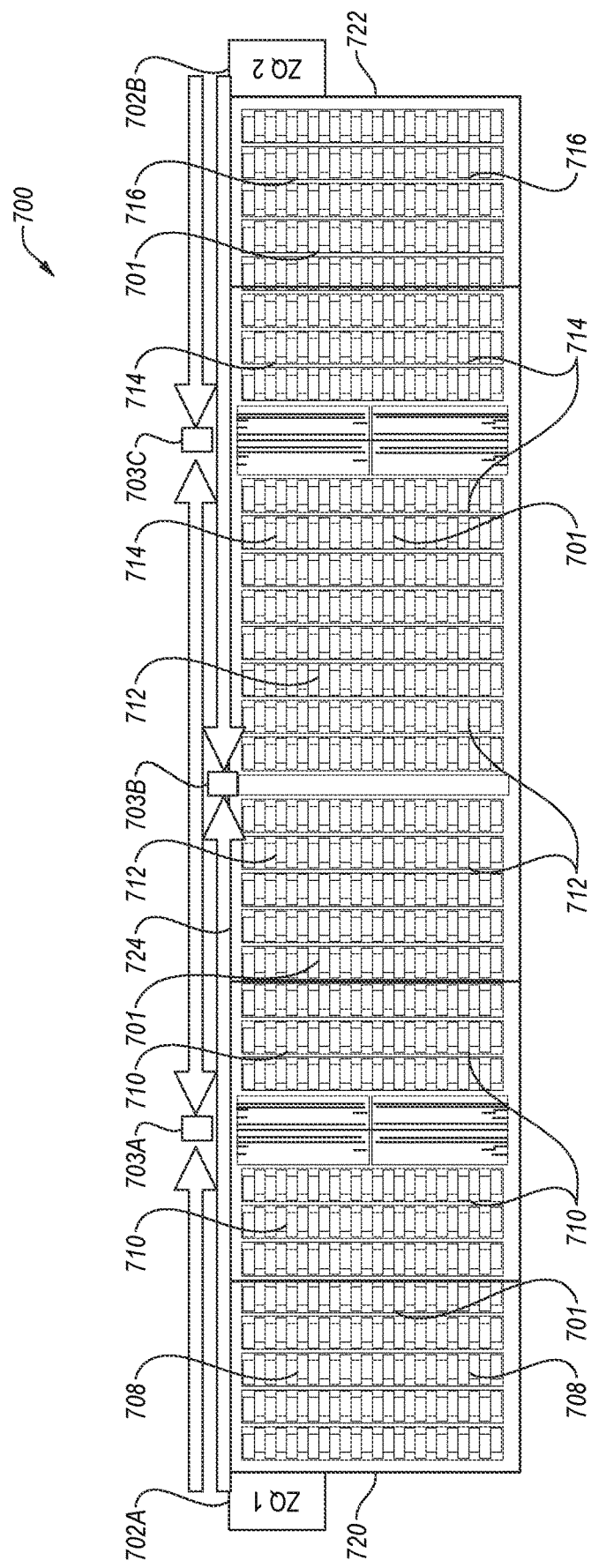
FIG. 7 is a layout diagram of an example memory device including a number of ZQ calibration circuits and a number of interpolation circuits, in accordance with various embodiments of the present disclosure.

FIG. 7 is a layout diagram of an example memory device 700 including a number of ZQ calibration circuits 702 and a number of interpolation circuits 703, in accordance with various embodiments of the present disclosure. According to various embodiments, each interpolation circuit 703 may be coupled to one or more other interpolation circuits 703. Further, in some embodiments, each interpolation circuit 703 may be coupled to one or more other ZQ calibration circuits 702.

Memory device 700 further includes I/O interface (PHY) 701 (e.g., including a number of I/O buffers). For example, memory device 700 may be a high bandwidth memory (HBM) device (e.g., HBM1 or HBM2 device). As described more fully below, memory device 700 is configured to interpolate ZQ calibration codes to determine interpolation codes (e.g., to compensate for process variation that may occur gradually between two locations of memory device 700).

In the embodiment illustrated in FIG. 7, ZQ calibration circuit 702A and ZQ calibration circuit 702B are positioned adjacent opposite edges of I/O interface 701. More specifically, ZQ calibration circuit 702A is positioned adjacent an edge 720 of I/O interface 701, and ZQ calibration circuit 702B is positioned adjacent an edge 722 of I/O interface 701. Further, each of interpolation circuit 703A, interpolation circuit 703B, and interpolation circuit 703C are positioned adjacent an edge 724 of I/O interface 701, which is adjacent each of edge 720 and edge 722.

According to various embodiments of the present disclosure, each ZQ calibration circuit and each interpolation circuit of memory device 700 may be associated with (e.g., cover and/or be positioned adjacent to) an associated area (also referred to herein as "portion") of I/O interface 701. More specifically, each ZQ calibration circuit and each interpolation circuit may be associated with a number of I/O buffers of I/O interface 701. For example, output buffers of areas of I/O interface 701 near edges 720 and 722 may be covered by ZQ calibration circuits, and other output buffers of I/O interface 701 (e.g., removed from edges 720 and 722 and/or near the middle of I/O interface 701) may be covered by interpolation circuits. Yet more specifically, for example, an area 708 of I/O interface 701 may be associated with (e.g., covered by and/or be positioned adjacent to) ZQ calibration circuit 702A, an area 710 of I/O interface 701 may be associated with (e.g., covered by and/or be positioned adjacent to) interpolation circuit 703A, an area 712 of I/O interface 701 may be associated with (e.g., covered by and/or be positioned adjacent to) interpolation circuit 703B, an area 714 of I/O interface 701 may be associated with (e.g., covered by and/or be positioned adjacent to) interpolation circuit 703C, and an area 716 of I/O interface 701 may be associated with (e.g., covered by and/or be positioned adjacent to) ZQ calibration circuit 702B.

As will be appreciated, process variation of memory device 700 may vary (e.g., gradually) between locations (e.g., between areas 708, 710, 712, 714, and 716) of I/O interface 701. More specifically, for example, process variation of memory device 700 may vary (e.g., gradually) between two locations of I/O interface 701 (e.g., between area 708 and area 716, between area 708 and area 712, between area 708 and area 710, etc.). Further, according to various embodiments disclosed herein, the amount of variation may be determined (e.g., estimated) via interpolation. More specifically, for example, a calibration code of one area of I/O interface 701 may be determined via two or more other known calibration codes for other areas of I/O interface 701.

As will be appreciated, ZQ calibration circuits 702A and 702B may be used to determine calibration codes for areas 708 and 716, respectively. Further, after determining calibration codes for areas 708 and 716, a calibration code for another area may be determined (i.e., via an associated interpolation circuit) based on the calibration codes for areas 708 and 716. Moreover, a calibration code for yet another area may be determined (i.e., via an associated interpolation circuit) based on at least two known calibration codes for other areas. Further, as will be appreciated, a calibration code for an area may be applied to one or more output drivers of the area (e.g., to turn one or more transistors of the area on or off).

Yet more specifically, for example, a calibration code for area 712 may be determined via interpolation circuit 703B based on a calibration code determined via ZQ calibration circuit 702A and a calibration code determined via ZQ calibration circuit 702B. As another example, a calibration code for area 714 may be determined via interpolation circuit 703C based on a calibration code determined via ZQ calibration circuit 702B and a calibration code determined via interpolation circuit 703B. Further, as yet another example, a calibration code for area 710 may be determined via interpolation circuit 703A based on a calibration code determined via ZQ calibration circuit 702A and a calibration code determined via interpolation circuit 703B.

As will be appreciated by a person having ordinary skill in the art, an interpolation circuit may be configured to receive at least two inputs, and generate an output based on the at least two inputs. For example, in an embodiment including one interpolation circuit, which is associated with an area substantially halfway between areas 708 and 716, is used, the interpolation circuit (e.g., interpolation circuit 703B) may determine a code for the area according to the following equation:

$$(\text{code generated via } ZQ \text{ calibration circuit } 702A + \text{code generated via } ZQ \text{ calibration circuit } 702B)/(N+1); \quad (1)$$

wherein N is the number of interpolation circuits (i.e., N=1 in this example).

In one contemplated example, a calibration code of area 708 (i.e., determined via ZQ calibration circuit 702A) may be fifteen (15) and a calibration code of area 716 (i.e., determined via ZQ calibration circuit 702B) may be five (5). Further, based on interpolation performed via equation (1), a calibration code of area 712 (i.e., determined via interpolation circuit 703B) may be ten (10).

As another example, assuming an area of interest is not substantially halfway positioned between the ZQ calibration areas, multipliers for each ZQ calibration circuit may be determined based on location of the interpolation circuits. More specifically, for example, assuming the area of interest is area 710, interpolation circuit 703A may determine a calibration code based on the following equation:

$$[(\text{code generated via ZQ calibration circuit } 702A * P1) + (\text{code generated via ZQ calibration circuit } 702B * P2)]/(N+1); \quad (2)$$

wherein P1 represents a position of interpolation circuit 703A relative to ZQ calibration circuit 702A (P1=3 in the example of FIG. 7), P2 represents a position of interpolation circuit 703A relative to ZQ calibration circuit 702B (P2=1 in the example of FIG. 7), and N is the number of interpolation circuits (i.e., N=3 in this example).

Further, for example, assuming the area of interest is area 714, interpolation circuit 703C may determine a calibration code based on the following equation:

$$[(\text{code generated via ZQ calibration circuit } 702A * P3) + (\text{code generated via ZQ calibration circuit } 702B * P4)]/(N+1); \quad (3)$$

wherein P3 represents a position of interpolation circuit 703C relative to ZQ calibration circuit 702A (P3=1 in the example of FIG. 7), P4 represents a position of interpolation circuit 703C relative to ZQ calibration circuit 702B (P4=3 in the example of FIG. 7), and N is the number of interpolation circuits (i.e., N=3 in this example).

Thus, in this example, a calibration code of area 710 (i.e., determined via interpolation circuit 703A) may be twelve and a half (12.5), and a calibration code of area 714 (i.e., determined via interpolation circuit 703C) may be seven and a half (7.5).

As another example, interpolation may be performed based on a result generated via ZQ calibration circuit 702A and a result generated via interpolation circuit 703B. More specifically, for example, assuming the area of interest is area 710, and assuming the same example code values provided above, interpolation circuit 703A may determine a calibration code based on the following equation:

$$(\text{code generated via ZQ calibration circuit } 702A + \text{code generated via interpolation circuit } 703B)/2 \quad (4)$$

As yet another example, interpolation may be performed based on a result generated via ZQ calibration circuit 702B and a result generated via interpolation circuit 703B. More specifically, for example, assuming the area of interest is area 714, and assuming the same example code values provided above, interpolation circuit 703C may determine a calibration code based on the following equation:

$$(\text{code generated via interpolation circuit } 703B + \text{code generated via ZQ calibration circuit } 702B)/2 \quad (5)$$

As will be appreciated, an interpolation circuit may require less area and/or use less resources than a ZQ calibration circuit. Therefore, utilizing one or more interpolation circuits (i.e., in place of one or more ZQ calibration circuits) may save area and/or resources. Further, utilizing interpolation circuits (e.g., as shown in FIG. 7) may decrease a likelihood of interrupting signal lines (e.g., data bus) positioned proximate an I/O interface. Furthermore, according to some embodiments, an interpolation circuit may not require a reference resistor and layout sensitivity, and thus utilizing one or more interpolation circuits (i.e., in place of one or more ZQ calibration circuits) may simplify the design of a semiconductor device.

Figure 8:
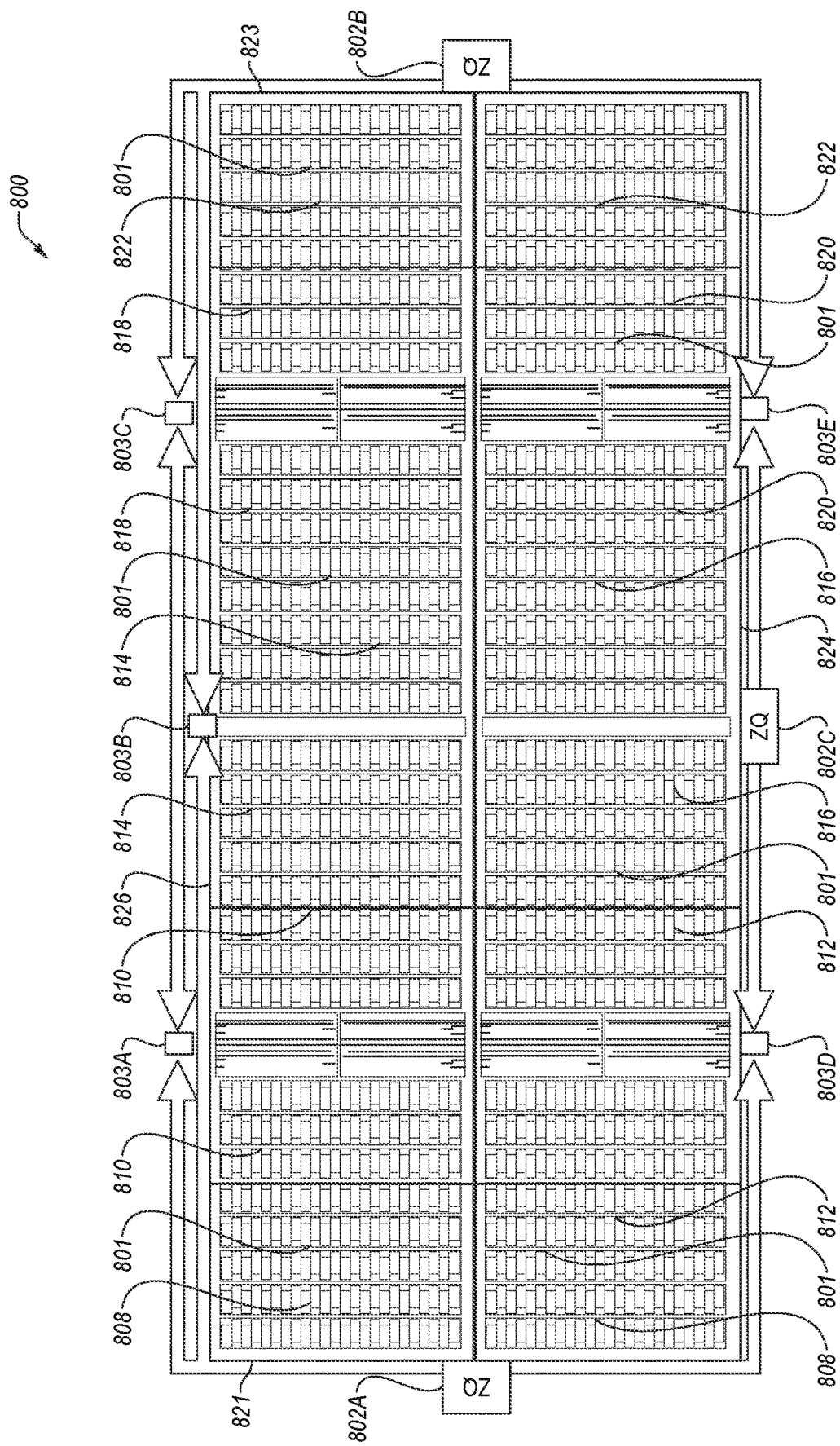
FIG. 8 is a layout diagram of another example memory device including a number of ZQ calibration circuits and a number of interpolation circuits, according to various embodiments of the present disclosure.

For example, various embodiments may be applicable to other, larger devices, (e.g., HBM3 devices), which may include an I/O interface area that is larger than HBM devices. FIG. 8 is a layout diagram of another example memory device 800 including a number of ZQ calibration circuits 802 and a number of interpolation circuits 803, in accordance with various embodiments of the present disclosure. According to various embodiments, each interpolation circuit 803 may be coupled to one or more other interpolation circuits 803. Further, in some embodiments, each interpolation circuit 803 may be coupled to one or more other ZQ calibration circuits 802. Memory device 800 further includes I/O interface (PHY) 801. For example, memory device 800 may include a HBM3 device.

In the embodiment illustrated in FIG. 8, ZQ calibration circuit 802A and ZQ calibration circuit 802B are positioned adjacent opposite edges of I/O interface 801. More specifically, ZQ calibration circuit 802A is positioned adjacent an edge 821 of I/O interface 801, and ZQ calibration circuit 802B is positioned adjacent an edge 823 of I/O interface 801. Further, ZQ calibration circuit 802C may be positioned adjacent an edge 824 of I/O interface 801, which is adjacent each of edge 821 and edge 823. Also, each of interpolation circuit 803A, interpolation circuit 803B, and interpolation circuit 803C are positioned adjacent an edge 826 of I/O interface 801, which is adjacent each of edge 821 and edge 823. Moreover, each of interpolation circuit 803D and interpolation circuit 803E are positioned adjacent edge 824.

According to various embodiments of the present disclosure, each ZQ calibration circuit and each interpolation circuit of memory device 800 may be associated with (e.g., cover and/or be positioned adjacent to) an associated area (also referred to herein as "portion") of I/O interface 801. More specifically, for example, an area 808 of I/O interface 801 may be associated with (e.g., covered by and/or be positioned adjacent to) ZQ calibration circuit 802A, an area 810 of I/O interface 801 may be associated with (e.g., covered by and/or be positioned adjacent to) interpolation circuit 803A, an area 812 of I/O interface 801 may be associated with (e.g., covered by and/or be positioned adjacent to) interpolation circuit 803D, an area 814 of I/O interface 801 may be associated with (e.g., covered by and/or be positioned adjacent to) interpolation circuit 803B, an area 816 of I/O interface 801 may be associated with (e.g., covered by and/or be positioned adjacent to) ZQ calibration circuit 802C, an area 818 of I/O interface 801 may be associated with (e.g., covered by and/or be positioned adjacent to) interpolation circuit 803C, an area 820 of I/O interface 801 may be associated with (e.g., covered by and/or be positioned adjacent to) interpolation circuit 803E, and an area 822 of I/O interface 801 may be associated with (e.g., covered by and/or be positioned adjacent to) ZQ calibration circuit 802B.

As will be appreciated, ZQ calibration circuits 802A and 802B may be used to determine calibration codes for areas 808 and 822, respectively. Further, after determining calibration codes for areas 808 and 822, a calibration code for another area may be determined (i.e., via an associated interpolation circuit) based on the calibration codes for areas 808 and 822. Moreover, a calibration code for yet another area may be determined (i.e., via an associated interpolation circuit) based on at least two known calibration codes. Further, as will be appreciated, a calibration code for an area may be used to tune I/O circuitry (e.g., turn one or more transistors of the area on or off) associated with the area.

Yet more specifically, for example, a calibration code for area 814 may be determined via interpolation circuit 803B based on a calibration code determined via ZQ calibration circuit 802A and a calibration code determined via ZQ calibration circuit 802B. As another example, a calibration code for area 818 may be determined via interpolation circuit 803C based on a calibration code determined via ZQ calibration circuit 802B and a calibration code determined via interpolation circuit 803B. Further, as yet another example, a calibration code for area 820 may be determined via interpolation circuit 803E based on a calibration code determined via ZQ calibration circuit 802C and a calibration code determined via ZQ calibration circuit 802B. As another example, a calibration code for area 812 may be determined via interpolation circuit 803D based on a calibration code determined via ZQ calibration circuit 802A and a calibration code determined via ZQ calibration circuit 802C. As yet another example, a calibration code for area 810 may be determined via interpolation circuit 803A based on a calibration code determined via ZQ calibration circuit 802A and a calibration code determined via interpolation circuit 803B.

In one contemplated example, a calibration code of area 808 (i.e., determined via ZQ calibration circuit 802A) may be fifteen (15) and a calibration code of area 822 (i.e., determined via ZQ calibration circuit 802B) may be five (5). Further, based on interpolation, a calibration code of area 814 (i.e., determined via interpolation circuit 803B) may be ten (10), a calibration code of area 810 (i.e., determined via interpolation circuit 803A) may be twelve and a half (12.5), and a calibration code of area 818 (i.e., determined via interpolation circuit 803C) may be seven and a half (7.5).

Continuing with this example (i.e., wherein the calibration code of area 808 is fifteen (15) and the calibration code of area 822 is five (5)), if a calibration code of area 816 (i.e., determined via ZQ calibration circuit 802C) is ten (10), then a calibration code of area 812 may be substantially equal to the calibration code of area 810, and a calibration code of area 820 may be substantially equal to the calibration code of area 818. However, if a calibration code of area 816 (i.e., determined via ZQ calibration circuit 802C) is not ten (10), then a calibration code of area 812 (i.e., determined via interpolation circuit 803D based on the calibration codes of areas 808 and 816) may not be substantially equal to the calibration code of area 810, and/or a calibration code of area 820 (i.e., determined via interpolation circuit 803E based on the calibration codes of areas 816 and 822) may not be substantially equal to the calibration code of area 818.

It is noted that memory device 700 of FIG. 7 includes two (2) ZQ calibration circuits and three (3) interpolation circuits, and memory device 800 of FIG. 8 includes three (3) ZQ calibration circuits and five (5) interpolation circuits. However, the present disclosure is not limited to any specific number of ZQ calibration circuits and/or interpolation circuits. For example, a number of ZQ calibration circuits and/or a number of interpolation circuits may vary (e.g., based on accuracy requirements, size requirements, power requirements, and/or any other requirement). Further, according to some embodiments, a number of ZQ calibration circuits and/or interpolation circuits included in a semiconductor device and/or positioning of the circuits may be considered to increase device efficiency and/or reduce device size.

Figure 9:
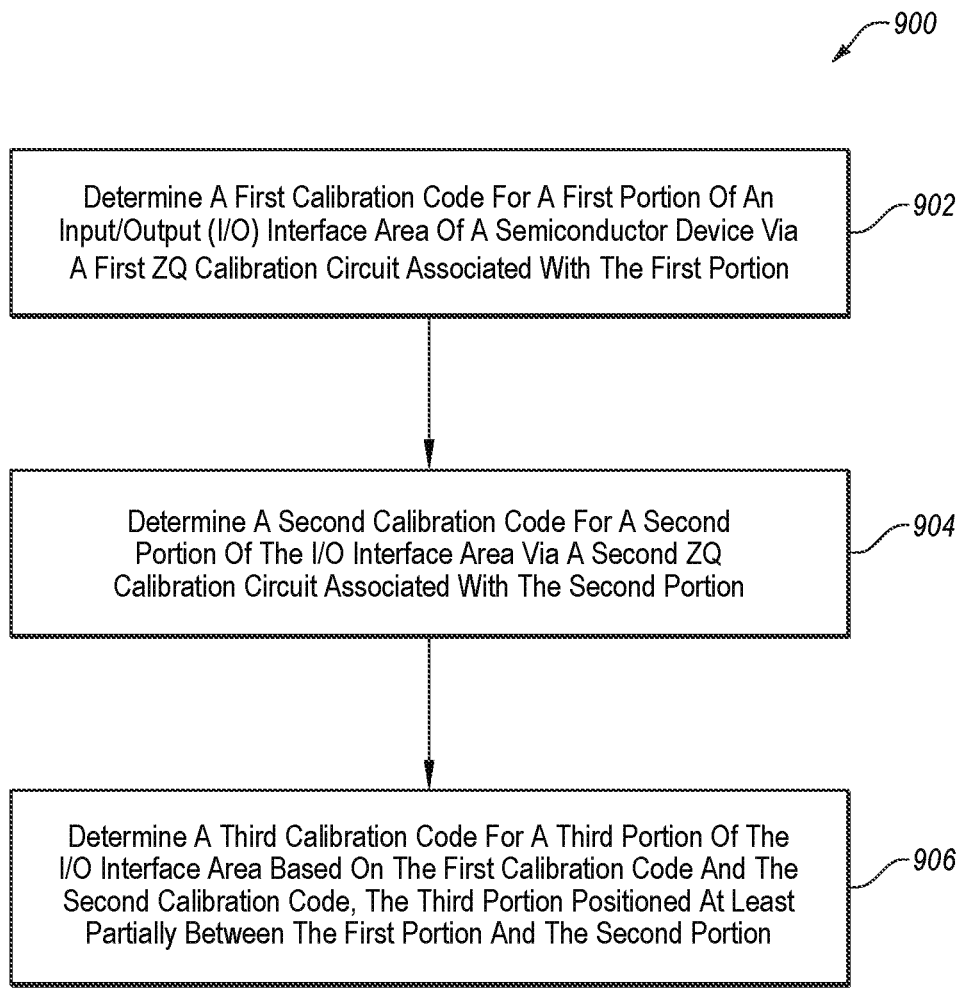
FIG. 9 is a flowchart of an example method of operating a semiconductor device, in accordance with various embodiments of the present disclosure.

FIG. 9 is a flowchart of an example method 900 of operating a semiconductor device, in accordance with various embodiments of the disclosure. Method 900 may be arranged in accordance with at least one embodiment described in the present disclosure. At least a portion of method 900 may be performed, in some embodiments, by a device or system, such as semiconductor memory device 100 of FIG. 1, memory device 700 of FIG. 7, memory device 800 of FIG. 8, a memory system 1000 of FIG. 10, and/or an electronic system 1100 of FIG. 11, or another device or system. For example, in some embodiments, all or part of method 900 may be performed during a semiconductor initialization process. Although illustrated as discrete blocks, various blocks may be divided into additional blocks, combined into fewer blocks, or eliminated, depending on the desired implementation.

Method 900 may begin at block 902, wherein a first calibration code for a first portion of an input/output (I/O) interface area of a semiconductor device may be determined via a first ZQ calibration circuit associated with the first portion, and method 900 may proceed to block 904. In one example, a calibration code for area 708 (see FIG. 7) may be determined via ZQ calibration circuit 702A. As another example, a calibration code for area 808 (see FIG. 8) may be determined via ZQ calibration circuit 802A.

At block 904, a second calibration code for a second portion of the I/O interface area may be determined via a second ZQ calibration circuit associated with the second portion, and method 900 may proceed to block 906. In one example, a calibration code for area 716 (see FIG. 7) may be determined via ZQ calibration circuit 702B. As another example, a calibration code for area 822 (see FIG. 8) may be determined via ZQ calibration circuit 802B. In yet another example, a calibration code for area 816 (see FIG. 8) may be determined via ZQ calibration circuit 802C.

At block 906, a third calibration code for a third portion of the I/O interface area may be determined based on the first calibration code and the second calibration code, wherein the third portion is positioned at least partially between the first portion and the second portion. In one example, a calibration code for area 712 (see FIG. 7) may be determined via interpolation circuit 703B based on the first calibration code and the second calibration code. As another example, a calibration code for area 814 (see FIG. 8) may be determined via interpolation circuit 803B based on the first calibration code and the second calibration code. In yet another example, a calibration code for area 820 (see FIG. 8) may be determined via interpolation circuit 803E based on the first calibration code and the second calibration code.

Modifications, additions, or omissions may be made to method 900 without departing from the scope of the present disclosure. For example, the operations of method 900 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein an additional calibration code for an additional portion of the semiconductor device may be determined based on the first calibration code and the third calibration code, wherein the additional portion is positioned at least partially between the first portion and the third portion. Further, for example, a method may include one or more acts wherein circuitry associated with a portion of the I/O interface area is tuned based on an associated calibration code.

A memory system is also disclosed. According to various embodiments, the memory system may include a controller and a number of memory devices. Each memory device may include one or more memory cell arrays, which may include a number of memory cells.

Figure 10:
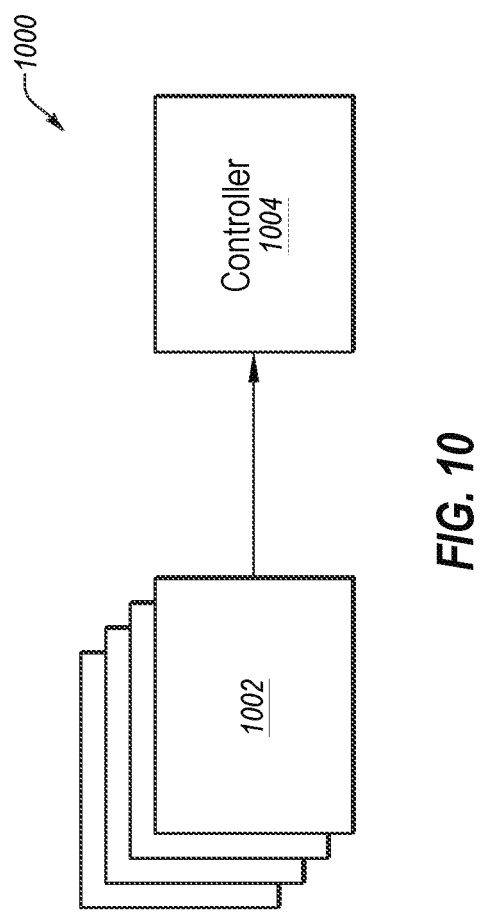
FIG. 10 is a simplified block diagram of a memory system, in accordance with various embodiments of the present disclosure.

FIG. 10 is a simplified block diagram of a memory system 1000 implemented according to one or more embodiments described herein. Memory system 1000, which may include, for example, a semiconductor device, includes a number of memory devices 1002 and a controller 1004. For example, at least one memory device 1002 may include a number of ZQ calibration circuits and a number of interpolation circuits, as described herein. Controller 1004 may be operatively coupled with memory devices 1002 so as to convey command and/or address signals to memory devices 1002.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 11:
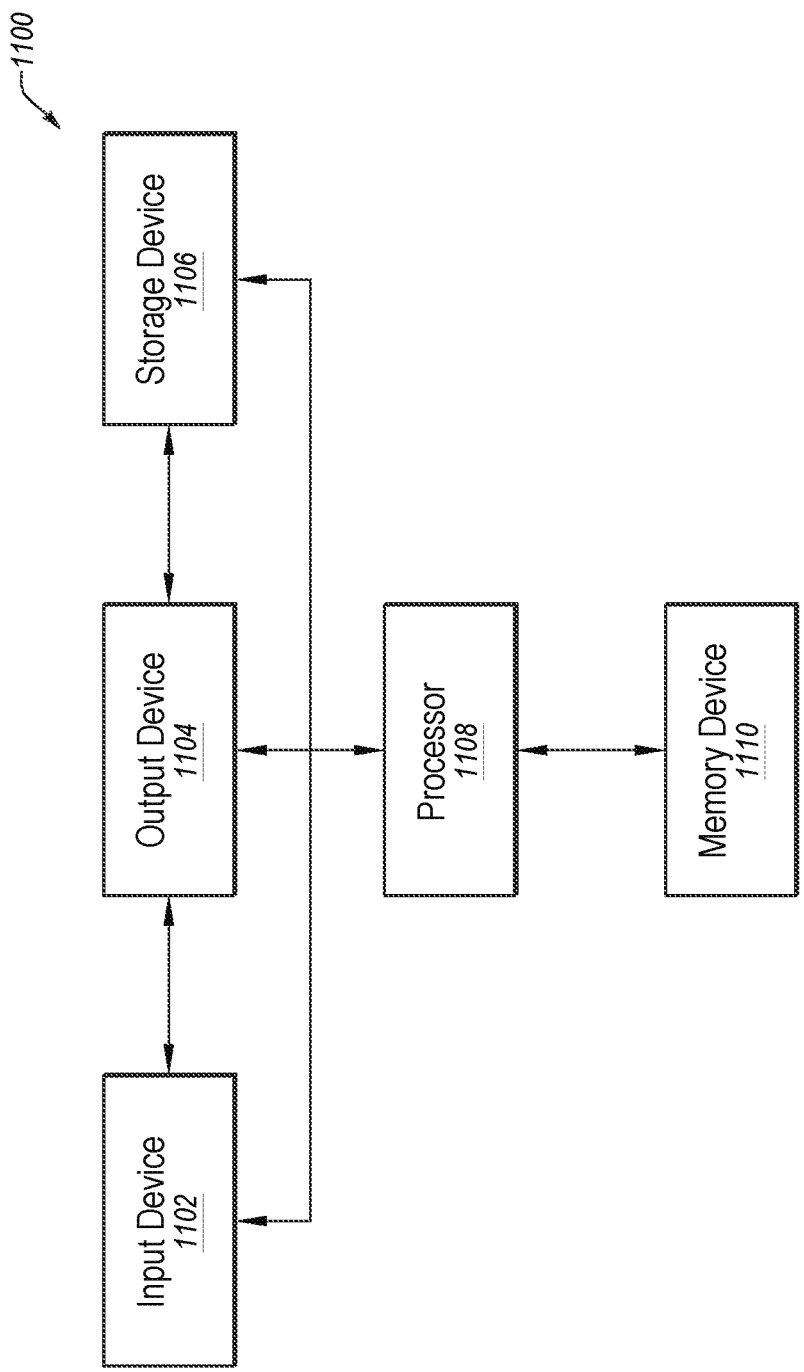
FIG. 11 is a simplified block diagram of an electronic system, in accordance with various embodiments of the present disclosure.

FIG. 11 is a simplified block diagram of an electronic system 1100 implemented according to one or more embodiments described herein. Electronic system 1100 includes at least one input device 1102, which may include, for example, a keyboard, a mouse, or a touch screen. Electronic system 1100 further includes at least one output device 1104, such as a monitor, a touch screen, or a speaker. Input device 1102 and output device 1104 are not necessarily separable from one another. Electronic system 1100 further includes a storage device 1106. Input device 1102, output device 1104, and storage device 1106 may be coupled to a processor 1108. Electronic system 1100 further includes a memory system 1110 coupled to processor 1108. Memory system 1110 may include memory system 1000 of FIG. 10. Electronic system 1100 may include, for example, a computing, processing, industrial, or consumer product. For example, without limitation, electronic system 1100 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a semiconductor device. The semiconductor device may include an input/output (I/O) interface area. The semiconductor device may also include a number of ZQ calibration circuits, wherein each of the number of ZQ calibration circuits is positioned adjacent to an associated portion of the I/O interface area. The device may also include a number of interpolation circuits, wherein each of the number of interpolation circuits is positioned adjacent to an associated portion of the I/O interface area and configured to generate a calibration code based on a number of other calibration codes. Further, each of the number of interpolation circuits may be coupled to one or more other interpolation circuits of the number of interpolation circuits, one or more ZQ calibration circuits of the number of ZQ calibration circuits, or any combination thereof. Moreover, portions of the I/O interface area associated with the number of interpolation circuits are at least partially positioned between portions of the I/O interface area associated with the number of ZQ calibration circuits.

In another embodiment, a device may include an input/output (I/O) interface area. The device may further include a first ZQ calibration circuit configured to generate a first calibration code for a first portion of the I/O interface area. The device may also include a second ZQ calibration circuit configured to generate a second calibration code for a second portion of the I/O interface area.

According to another embodiment of the present disclosure, a method may include determining a first calibration code for a first portion of an input/output (I/O) interface area of a semiconductor device via a first ZQ calibration circuit associated with the first portion. The method may also include determining a second calibration code for a second portion of the I/O interface area of the semiconductor device via a second ZQ calibration circuit associated with the second portion. Further, the method may include determining a third calibration code for a third portion of the I/O interface area of the semiconductor device based on the first calibration code and the second calibration code, wherein the third portion is positioned at least partially between the first portion and the second portion.

According to another embodiment of the present disclosure, a method may include determining a first calibration code for a first portion of an input/output (I/O) interface area of a semiconductor device via a first ZQ calibration circuit associated with the first portion. Further, the method may include determining a second calibration code for a second portion of the I/O interface area of the semiconductor device via a second ZQ calibration circuit associated with the second portion. The method may also include tuning the first portion of the I/O interface based on the first calibration code. Moreover, the method may include tuning the second portion of the I/O interface based on the second calibration code.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device. The at least one memory device may include an input/output (I/O) interface including a number of areas. The at least one memory device may also include a first ZQ calibration circuit positioned adjacent to a first area of the number of areas of the I/O interface area. The at least one memory device may also include a second ZQ calibration circuit positioned adjacent to a second area of the number of areas of the I/O interface area. Also, the at least one memory device may include a first interpolation circuit coupled to each of the first ZQ calibration circuit and the second ZQ calibration circuit and positioned adjacent to a third area of the number of areas of the I/O interface area, wherein the third area is at least partially positioned between the second area and the first area.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
a number of impedance calibration circuits, each impedance calibration circuit positioned adjacent an associated portion of an I/O interface area; and
an interpolation circuit configured to generate a calibration code via interpolation of two or more other calibration codes generated via a number of circuits including one or more impedance calibration circuits of the number of impedance calibration circuits, another interpolation circuit, or any combination thereof, the interpolation circuit positioned adjacent an associated portion of the I/O interface area;
the portion of the I/O interface area associated with the interpolation circuit at least partially positioned between a first portion of the I/O interface area associated with a first circuit of the number of circuits and a second portion of the I/O interface area associated with a second circuit of the number of circuits.

2. The device of claim 1, wherein each of the number of impedance calibration circuits is configured to generate a calibration code used to tune circuitry of the associated portion of the I/O interface area.

3. The device of claim 1, wherein the number of impedance calibration circuits comprises at least two (2) impedance calibration circuits.

4. The device of claim 3, further comprising at least two (2) additional interpolation circuits, each portion of the I/O interface area associated with the interpolation circuit and the at least two (2) additional interpolation circuits positioned at least partially between the first portion of the I/O interface area associated with a first impedance calibration circuit of the at least two (2) impedance calibration circuits and the second portion of the I/O interface area associated with a second impedance calibration circuit of the at least two (2) impedance calibration circuits.

5. The device of claim 4, wherein the portion of the I/O interface area associated with the interpolation circuit is at least partially positioned between a fourth portion of the I/O interface area associated with a first interpolation circuit of the at least two (2) additional interpolation circuits and a fifth portion of the I/O interface area associated with a second interpolation circuit of the at least two (2) additional interpolation circuits.

6. The device of claim 1, wherein each of the number of impedance calibration circuits are positioned adjacent either a first edge of the I/O interface area or a second edge of the I/O interface area, the second edge opposite the first edge.

7. The device of claim 6, wherein the interpolation circuit is positioned adjacent either a third edge of the I/O interface area or a fourth edge of the I/O interface area, each of the third edge of the I/O interface area and the fourth edge of the I/O interface area adjacent each of the first edge of the I/O interface area and the second edge of the I/O interface area.

8. The device of claim 1, wherein each of the number of impedance calibration circuits are positioned adjacent either a first edge of I/O interface area, a second edge of the I/O interface area, or a third edge of the I/O interface area, the first edge opposite the second edge and adjacent the third edge.

9. The device of claim 8, wherein the interpolation circuit is positioned adjacent either the third edge of the I/O interface area or a fourth edge of the I/O interface area, the third edge opposite the fourth edge.

10. A method, comprising:
determining first and second impedance calibration codes for a semiconductor device, the first impedance calibration code associated with a first portion of an I/O interface of the semiconductor device and the second impedance calibration code associated with a second portion of the I/O interface; and determining a third calibration code for the semiconductor device via interpolation of the first and second impedance calibration codes, the third calibration code associated with a third portion of the I/O interface, the third portion of the I/O interface at least partially positioned between the first portion of the I/O interface and the second portion of the I/O interface.

11. The method of claim 10, wherein determining the third calibration code comprises determining the third calibration code for the third portion of the I/O interface via an interpolation circuit associated with the third portion of the I/O interface.

12. The method of claim 10, further comprising determining a fourth calibration code for a fourth portion of the I/O interface based on the first impedance calibration code and the third calibration code, the fourth portion positioned at least partially between the first portion associated with the first impedance calibration code and the third portion associated with the third calibration code.

13. The method of claim 12, further comprising determining a fifth calibration code for a fifth portion of the I/O interface based on the second impedance calibration code and the third calibration code, the fifth portion positioned at least partially between the second portion associated with the second impedance calibration code and the third portion.

14. The method of claim 13, further comprising:
tuning circuitry of the first portion of the I/O interface area based on the first impedance calibration code;
tuning circuitry of the second portion of the I/O interface area based on the second impedance calibration code;
tuning circuitry of the third portion of the I/O interface area based on the third calibration code;
tuning circuitry of the fourth portion of the I/O interface area based on the fourth calibration code; and
tuning circuitry of the fifth portion of the I/O interface area based on the fifth calibration code.

15. The method of claim 10, further comprising:
tuning circuitry of the first portion of an I/O interface area based on the first impedance calibration code;
tuning circuitry of the second portion of the I/O interface area based on the second impedance calibration code; and
tuning circuitry of the third portion of the I/O interface area based on the third calibration code.

16. A system, comprising:
at least one input device;
at least one output device;
at least one processor device operably coupled to the input device and the output device; and
at least one memory device operably coupled to the at least one processor device and comprising:
a first calibration circuit positioned adjacent a first portion of an I/O interface and configured to generate a first calibration code;
a second calibration circuit positioned adjacent a second portion of the I/O interface and configured to generate a second calibration code; and
an interpolation circuit coupled to each of the first calibration circuit and the second calibration circuit and positioned adjacent a third portion of the I/O interface, the interpolation circuit configured to generate a third calibration code via interpolation of the first calibration code and the second calibration code, the third portion of the I/O interface at least partially positioned between the first portion of the I/O interface and the second portion of the I/O interface.

17. The system of claim 16, further comprising a second interpolation circuit configured to generate a fourth calibration code in response receipt of the third calibration code and the second calibration code.

18. The system of claim 17, further comprising a third interpolation circuit configured to generate a fifth calibration code in response receipt of the third calibration code and the first calibration code.

19. The system of claim 18, further comprising a fourth interpolation circuit configured to generate a sixth calibration code in response receipt of the first calibration code and the second calibration code, wherein the fourth interpolation circuit and the interpolation circuit are positioned adjacent opposite edges of the I/O interface.

20. The system of claim 16, wherein the first calibration circuit and the second calibration circuit are positioned adjacent opposite edges of the I/O interface.

* * * * *